United States Patent [19]
Nakanishi

[11] 3,942,122
[45] Mar. 2, 1976

[54] MULTIBAND TUNER CONTROL SYSTEM
[75] Inventor: Mutsuo Nakanishi, Villa Park, Ill.
[73] Assignee: Quasar Electronics Corporation, Franklin Park, Ill.
[22] Filed: Oct. 15, 1974
[21] Appl. No.: 514,650

[52] U.S. Cl. ................................ 325/459; 325/464
[51] Int. Cl.² .......................................... H04B 1/16
[58] Field of Search ........... 325/431, 432, 453, 458, 325/459, 460, 461, 464, 465; 334/15; 321/66

[56] References Cited
UNITED STATES PATENTS

| | | | |
|---|---|---|---|
| 2,785,297 | 3/1957 | Scandurra | 325/461 |
| 3,568,112 | 2/1971 | Thomas | 334/15 |
| 3,693,091 | 9/1972 | Russell | 325/465 |

*Primary Examiner*—Benedict V. Safourek
*Attorney, Agent, or Firm*—LaValle D. Ptak

[57] ABSTRACT

A multiband tuner control system, particularly adapted for television receivers, utilizes, a three-band varactor VHF tuner. The bands include low and high band VHF signals and a third band of signals obtained from the UHF signals following a first conversion to a third VHF frequency band. This third band is selectively switched to the tuner under the control of channel selection switches. The channel selection switches also cause the conversion of UHF signals to the VHF band to be effected by mixing the UHF signals with a different fixed frequency local oscillator signal in the first converter for each different decade of channels of the UHF signal. The channel selection switches automatically cause this to happen and also select a proper tuning potentiometer associated with the selected UHF or VHF band directly in accordance with the two-digit channel number. The switching of the bands of the tuner is effected automatically by the channel selection switches, as is the switching between the VHF input signals and the converted UHF signals.

6 Claims, 5 Drawing Figures

MULTIBAND TUNER CONTROL SYSTEM

BACKGROUND OF THE INVENTION

For many years, mechanical turret tuners have been commonly employed in television receivers to select the VHF channels and a second rotary or continuous tuner has been used to select the UHF channels. For most television receivers, this requires two different channel selection knobs; and the tuners themselves are relatively bulky and require a relatively large amount of space within the television receiver cabinet. Because of the nature of these tuners, it also is necessary to locate them directly behind the front level panel of the receiver, which imposes significant restrictions on the cabinet design and the arrangement of parts within the cabinet, reducing the flexibility of design which would be possible if such tuners could be eliminated.

Some mechanical tuners are equipped with programmable switches to permit them to be used to select either a UHF or a VHF channel at a tuner position by programming the tuner for the local area where the television receiver is to be used. The disadvantages of the cumbersome mechanical tuners, however, are not overcome. Instead, the tuner is made even more complicated by such an arrangement.

It is desirable, and in the U.S. it is becoming necessary, to effect selection of the UHF and VHF channels in a comparable manner. When such tuning compatibility is imposed, significant problems are encountered in providing a mechanical turret-type tuner having detented positions for all of the possible UHF channels which must be accommodated for television receivers capable of operating in any given locality in which the receiver is capable of receiving transmitted television signals. UHF turret tuners with detent tuning selection for each of the 70 possible UHF channels are difficult and expensive to manufacture, and even the display of all of the UHF channel numbers in a manner which is compatible with the display for the much smaller number of VHF channels is difficult to accomplish.

The introduction of voltage-variable capacitor or varactor tuners for the VHF and UHF bands to which a television receiver can be tuned has opened the way for electronic tuning of television receivers. This replaces the cumbersome mechanical turret tuners and allows greater flexibility in the design of the channel selection panel and in the location of tuner parts within the receiver cabinet. Even so, if the receiver is to be made capable of individual selection of any one of the 70 UHF channels in addition to the VHF channels, it has been necessary to provide a large number of individual tuning components. For example, in many prior art electronic tuner control circuits, it has been necessary to provide a separate tuning potentiometer for each of the 70 UHF channels if full capability of UHF channel selection is desired. This results in a relatively expensive tuner configuration requiring a large number of parts.

As a compromise, the number of UHF channels to which any individual receiver can be tuned generally is reduced to a number comparable to the number of VHF channels. Then, when the receiver is placed in operation in a given locality, the UHF channels in that locality are tuned by selected ones of the available UHF potentiometers. A number or some other indicia is placed on the display portion of the tuner control panel to indicate the number of the particular UHF channel which thereafter is to be selected at that position by the tuner control. Of course, if the receiver later is moved to another locality, this necessitates retuning of the UHF channels and also means that a change in the indicia on the tuner control panel must be made. This clearly is not an optimum solution to providing compatible tuning of UHF and VHF channels.

It is desirable to provide a television tuning control system which is capable of tuning to any channel which the receiver can receive with equal ease of selection of VHF or UHF channels. In addition, it is desirable to provide a tuner control system which uses a minimum number of parts and which does not require re-programming when the receiver is moved from one locality to another.

SUMMARY OF THE INVENTION

Accordingly, it is an object of this invention to provide an improved tuner control system.

It is another object of this invention to provide an improved electronic tuner control system.

It is an additional object of this invention to provide an improved tuner control system for a multiband receiver such as a television receiver.

It is still another object of this invention to provide a tuner control system for a television receiver which is capable of tuning to any channel in the VHF and UHF bands by directly selecting the channel number.

It is a further object of this invention to minimize the number of components required to provide full tuning capability for a television receiver having comparable channel selection for all of the VHF and UHF channels to which the receiver can be tuned.

In accordance with a preferred embodiment of this invention, a tuning control system for a multiband receiver, particularly useful with a television receiver, includes a first mixer circuit to which input signals of one of the bands are applied. A variable frequency oscillator responds to a control input signal to supply signals to the first mixer circuit at one of a number of different frequencies, each having a predetermined relationship with a predetermined portion of the frequencies of the signals in the one of the frequency bands which are applied to the first mixer circuit. A switching circuit is provided with first and second inputs which are selectively coupled with its output. One of the inputs is connected with the output of the first mixer and the other input of the switching circuit is supplied with signals in at least one of the other frequency bands which the receiver is capable of receiving. A tuner circuit controllable for tuning the receiver to different received signals then receives the input signals from the output of the switching circuit, and a selection circuit for selecting stations within any of the frequency bands is provided. The selection circuit has a number of settings, some of which are coupled with the control input of the variable frequency oscillator circuit to select the oscillator output frequency which corresponds to the predetermined portion of the frequencies in the one frequency band applied to the first mixer in which the desired station frequency is located. The selection circuit also controls the operation of the switching circuit to couple one or the other of the first and second inputs with the output; and finally, the selection circuit operates to control the tuner circuit in accordance with the setting of the selection circuit to select the particular station to which the receiver is being tuned.

In a more specific embodiment of the invention, the selection circuit comprises a pair of switch banks, one of which is used to select the tens digit of a television station channel number and the other of which is used to select the units digit. The direct selection of these two digits affects the necessary control of the variable frequency oscillator, the switching circuit, and control of the tuner circuit to tune the receiver to the channel selected by the two digits represented by the channel selection switches.

DETAILED DESCRIPTION

Figure 1:
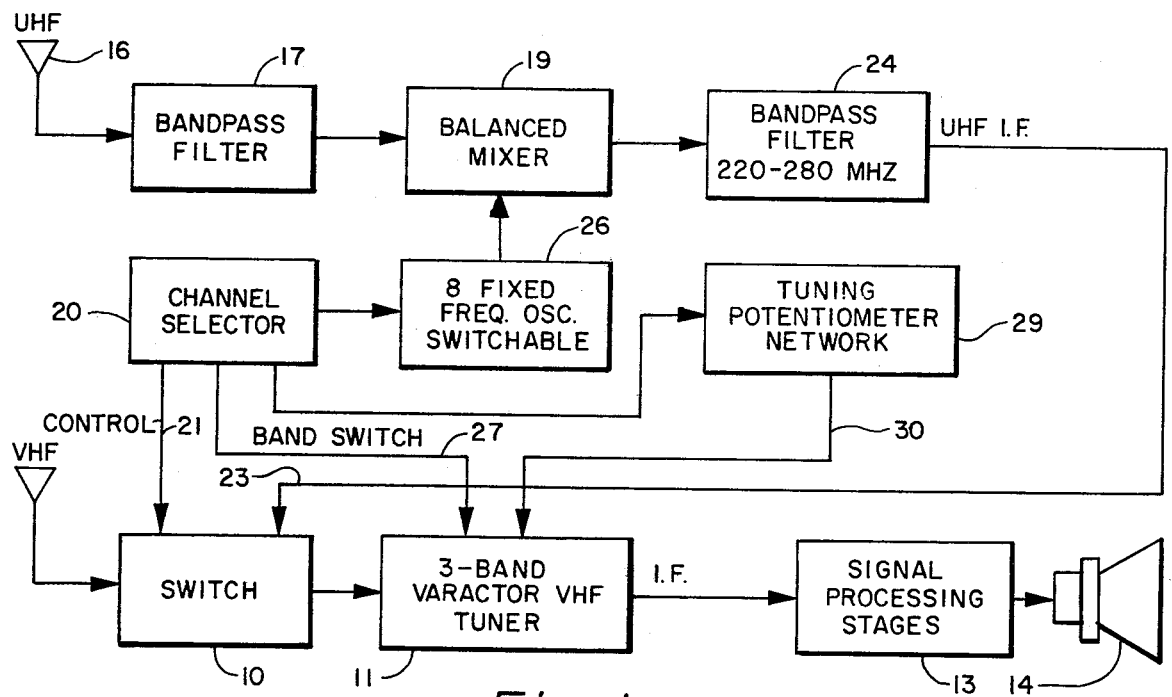
FIG. 1 is a schematic diagram, in block form of a preferred embodiment of the invention used with a television receiver.

Referring now to FIG. 1, there is shown a block diagram of a tuner control system which is uniquely capable of tuning to any one of the VHF and UHF channels transmitted by television transmitting stations by direct selection of the channel number in a channel selector.

VHF signals are received on an antenna 9 and are applied to a switching circuit or switch 10, which in one of its positions applies the received VHF signals from the output of the switch 10 to the input of a three-band varactor VHF tuner 11. The tuner 11 comprises tuning sections for handling the low-band VHF and high-band VHF in a conventional manner. In addition, the tuner 11 is modified for a third VHF band which is used to accommodate a UHF IF band generated for the UHF channels. The manner in which this is done is described subsequently in conjunction with the description of FIG. 4.

The tuner 11 provides the properly tuned IF output signals to the signal processing stages 13 of a conventional black and white or color television receiver, which in turn applies the signals to a cathode ray tube 14 for reproduction of the video images. The signal processing stages of the television receiver 13 also include the necessary processing circuitry and loud speaker for reproduction of the sound which accompanies the video signals reproduced on the cathode ray tube 14.

UHF signals for the television receiver are received on a UHF antenna 16 and are applied through a first bandpass filter 17 to a first input of a balanced mixer 19. The bandpass filter 17 has a pass band of 470 to 895 megahertz; so that it is capable of passing all of the signals in the UHF frequency band. A channel selector 20 is operated to directly select any one of the VHF or UHF channels. When a VHF channel is selected, a control output is applied by the channel selector on a control lead 21 to the switch 10 to couple the signals received on the VHF antenna to the input of the tuner 11. Whenever the channel selector 20 is operated to select any UHF channel, the control signal on the lead 21 causes the switch 10 to open the circuit from the VHF antenna 9 and to connect the output of the switch with an input obtained over a lead 23 from the output of a UHF bandpass filter 24 supplied with signals from the output of the balanced mixer 19. The bandpass filter 24 has a pass band of 220 to 280 megahertz, which is capable of accommodating 10 UHF channels spaced 6 megahertz apart in accordance with the standard U.S. television channel frequencies.

To select a particular UHF channel, the channel selector also controls a switchable oscillator circuit 26, which produces one of eight different fixed oscillator frequencies in accordance with each setting of the channel selector 20 for UHF channels. These eight frequencies are selected to have a unique relationship with the center frequency of each decade of channel frequencies in the UHF frequency band. This means that there is one oscillator frequency from the switchable oscillator circuit 26 for the UHF channels up to channel 19, a second oscillator frequency for the UHF channels 20 through 29, a third frequency for UHF channels from 30 to 39, etc., with the eighth frequency from the circuit 26 selected to uniquely correspond with the UHF channels 80 to 83. The frequencies selected are such that the output of the bandpass filter 24 includes signals between 220 and 280 megahertz corresponding to whichever one of the eight decades of channels in the UHF frequency band have been selected by the channel selector.

The channel selector 20 also supplies band switching signals, indicated as applied over a lead 27 to the tuner 11 to switch it for operation to the proper one of the low-band VHF, high-band VHF, or the new UHF IF band appearing on the output of the filter 24. In addition, the channel selector 20 operates a tuning potentiometer network 29 to cause that network to produce a tuning voltage uniquely selected to correspond directly to the VHF channel or to the particular one of the ten channels in the selected UHF decade, which has been selected by the channel selector 20. The unique tuning voltage for the selected channel is applied over an output lead 30 to the varactor tuner 11. This tuning voltage tunes the tuner 11 to the selected channel to produce the properly tuned IF signal to the signal processing stages 13 of the receiver.

Figure 2:
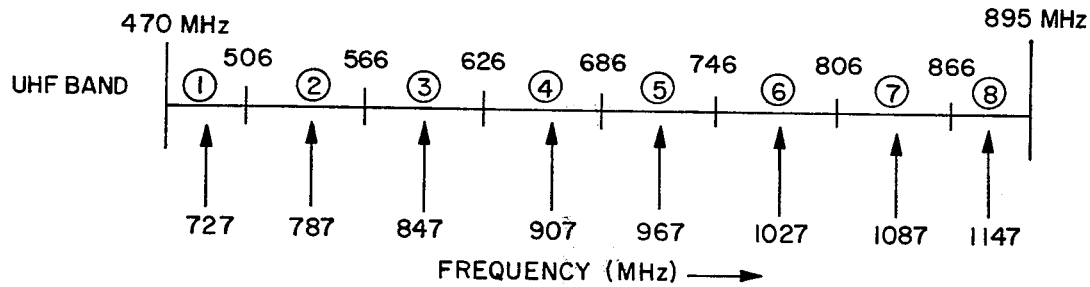
FIGS. 2 and 3 are charts showing frequency relationships useful in explaining the operation of the circuit of FIG. 1.
Figure 3:
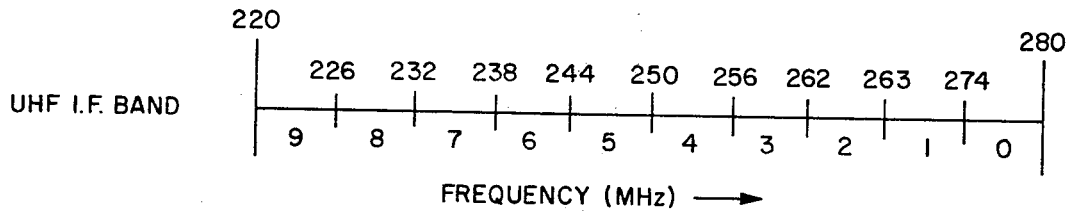

FIGS. 2 and 3 illustrate the relationships between the oscillator output frequencies of the switchable oscillator 26 with the UHF frequency band broken down into the UHF decades, 1 through 8, corresponding respectively to the UHF channels 14 to 19 for decade 1, 20 to 29 for decade 2, etc. In FIG. 2, the frequencies produced by the switchable oscillator 26 are shown across the bottom of the chart. These range from a low frequency of 727 megahertz for the tens decade of the UHF band to a high frequency of 1147 megahertz for the 80's decade of the UHF band, corresponding to channel numbers 80 and above. The corresponding frequencies for the other decades also are shown in FIG. 2.

Each decade of the UHF band in FIG. 2 is marked with the corresponding number having a circle drawn around it. In addition, the division frequencies for the different decades also are indicated. These correspond to the standard U.S. television channel frequencies, for example, 506 megahertz marks the dividing line between the upper frequency of the band for channel 19 and the lower frequency for channel 20. Similarly, 626 megahertz marks the line between the upper frequency for the band for channel 39 and the lowest frequency for the band for channel 40. This is true of each of the dividing line frequencies which are illustrated in FIG. 2 for separating the UHF band decades from one another.

The 10 decade does not include a full 60 megahertz bandwidth since channel 14 is the lowest UHF channel; so that there are not ten channels in this decade. Similarly, it is not necessary for the uppermost frequency of the UHF band to reach 60 megahertz above the 866 megahertz which is the dividing line between the seventh and eighth decades, because channel 83 is the highest numbered channel. Thus, the UHF band extends only to 895 megahertz. All of the other decades within the UHF band, however, are a full 60 megahertz wide, indicative of ten channels, each spaced 6 megahertz apart.

An illustration of the manner in which the received UHF frequencies are converted to new UHF IF frequencies is best understood in conjunction with the frequency relationships which are shown in both FIGS. 2 and 3. Assume the selector 20 sets the frequency of the oscillator 26 for the 20's UHF channel decade. As stated previously, the oscillator frequency for the 20's decade of the UHF band is 787 megahertz. The standard center frequency for channel 20 is 509 megahertz. Thus, the output of the balanced mixer 19 passed by the bandpass filter 24, for the condition when the oscillator output is 787 megahertz and a UHF station is transmitting on channel 20 is 278 megahertz. Similarly, for channel 29, at the high end of this same decade, the channel center frequency is 563 megahertz. When this is mixed with the 20's decade oscillator frequency of 787 megahertz, the output of the mixer 19, passed by the bandpass filter 24, is 224 megahertz. A similar set of conditions exists for each of the other UHF channel decades.

The lowest frequency passed by the bandpass filter 24 corresponds to the highest channel number in each decade and the highest frequency passed by the filter 24 corresponds to the lowest frequency in each UHF decade. The frequencies for each of the ten channels in each decade are 6 megahertz apart and are centered within the correspondingly numbered channel frequency ranges within each decade as indicated in FIG. 3.

In the example given for the 20's decade for tuning to channel 20, the converted UHF IF frequency of 278 megahertz falls in the UHF IF band in the "zero" slot between 274 and 280 megahertz. A similar result is obtained for a selection of any of the zero channels in each decade, such as channels 30, 40, etc. Whenever one of those channels is selected, the output frequency from the filter 24 is 278 megahertz.

At the other end of the UHF IF band is the 9th channel in each of the decades. For example, for channel 29, the output frequency of the bandpass filter 24 is 224 megahertz as described previously. This falls in the range 220 to 226 megahertz which is illustrated in FIG. 3. This is true for the ninth channel in each of the decades. Corresponding relationships are present for each of the other channels within each of the decades. For example, channel 5 of each decade (such as channels 25, 35, 45, etc.), lies in the frequency band 244 to 250 megahertz shown in FIG. 3.

Unlike the VHF bands, the UHF IF band requires an oscillator in the tuner 11 which is on the low side of the RF frequency at the output of the bandpass filter 24 to prevent double inversion of the carrier frequency. The UHF oscillator in the tuner section 11 covers a frequency range from 180 megahertz to 232 megahertz and ten pre-set voltages can be switched to select the desired channel within each decade selected by the output frequency of the oscillator 26.

Figure 4:
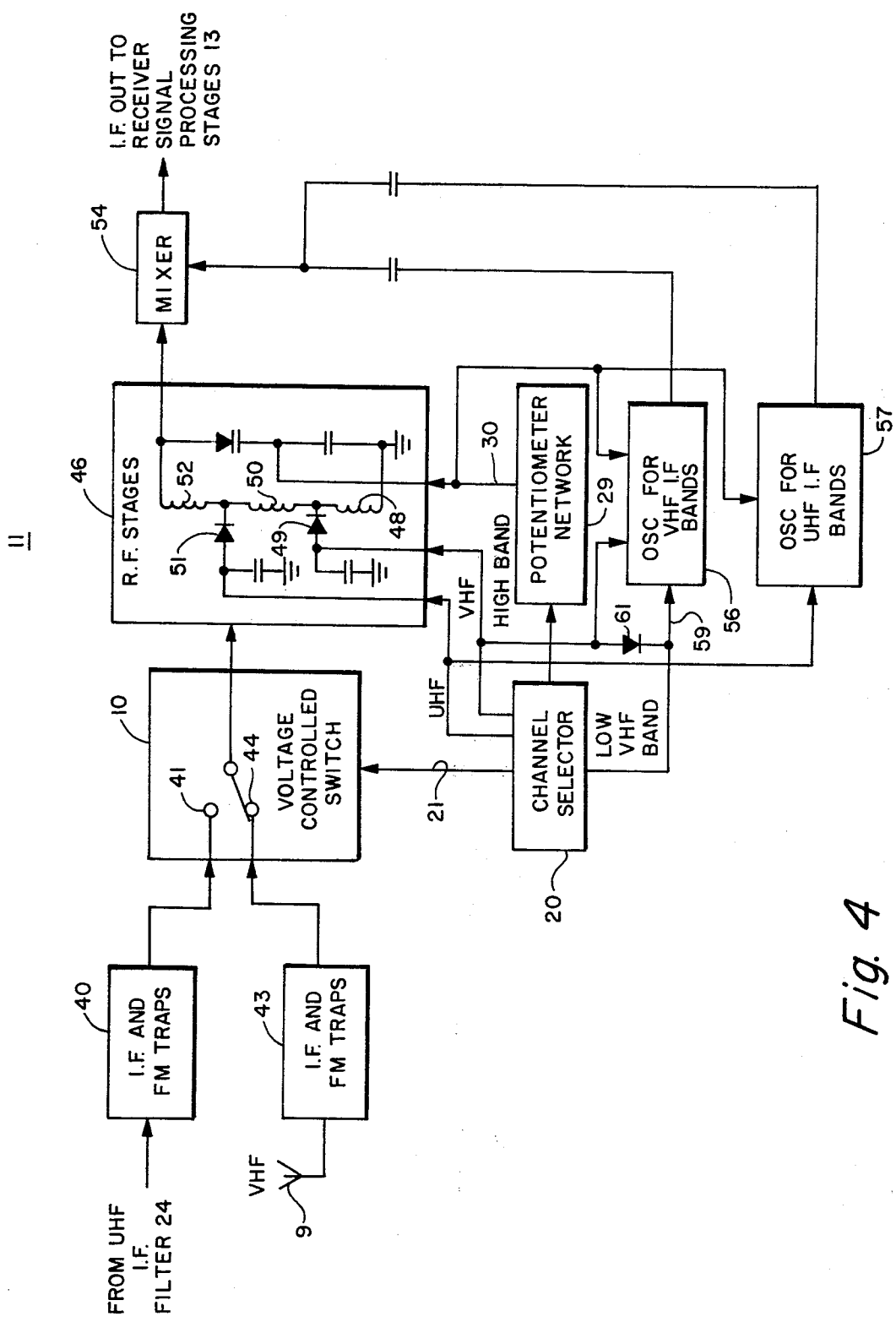
FIG. 4 is a schematic diagram, partially in block form, showing additional details of a portion of the circuit of FIG. 1.

Referring now to FIG. 4, there is shown a more detailed circuit diagram of the channel selection and tuner section of the circuit shown in FIG. 1. The same reference numbers are used in FIGS. 1 and 4 for the same or similar components. The signals from the UHF IF filter 24 are applied through a conventional IF and FM trap filter 40 to a first input terminal 41 of the switch circuit 10, which is illustrated as a voltage controlled switch. Similarly, the VHF signals appearing on the antenna 9 are applied through an IF and FM trap filter 43 to a second input terminal 44 of the voltage controlled switch 10. The switch 10 operates as a single-pole, single-throw switch and is shown connecting its output with the VHF input terminal 44. The particular one of the terminals 41 or 44 to which the switch output is connected, however, is effected by the channel selector circuit 20 in accordance with a control voltage applied over the lead 21. The specific configuration of the switch 10 can be any conventional voltage controlled analog switch. The details are not important to an understanding of the operation of this system.

The output of the voltage controlled switch 10 then is applied to RF signal processing stages 46, which comprise a part of the three-band VHF tuner 11 described previously in conjunction with FIG. 1. The RF stages 46 of the tuner are tuned by a varactor diode tuning circuit in accordance with the tuning voltage applied on the lead 30 from the Potentiometer network 29. In the RF states 46, a typical varactor tuned circuit is illustrated. Instead of using a conventional two-section tuned circuit for covering only the two VHF bands, however, the tuned circuit has been modified by adding a third coil and switching diode to accommodate the new UHF IF band also. The manner in which the response of the tuned circuit is modified by the application of a switching voltage over an appropriate lead from the channel selector 20 through switching diodes to the coils is the same as previously employed in conventional two-band VHF tuners.

Three coils, 52, 50, and 48 are in series when the tuned circuit in the RF stage 46 corresponds to the lowband VHF. When a switching voltage is applied to the diode 49, indicative of selection of a high-band VHF station by the channel selector 20, the coil 48 is shorted to ground by the diode 49, effectively reducing the total inductance of the tuned circuit of the RF stage 46. Finally, if a VHF channel is selected, a voltage is applied to a switching diode 51 which shorts coils 50 and 48 to ground, effectively reducing the inductance in the tuned circuit further to tune for the UHF IF band. The output of the mixer 54 then is the desired IF output which is supplied to the receiver signal processing stages 13 shown in FIG. 1.

The channel selector 20, as stated previously, selects the desired potentiometer in the potentiometer network 29 for applying the desired tuning voltage on the output lead 30. In addition to being applied to the RF stages 46 of the tuner, the tuning voltage on the lead 30 also is applied to a VHF oscillator section 56 and a UHF IF band oscillator 57 to tune those oscillators. Whenever either a low-band VHF or a high-band VHF channel is selected, an input is applied over a lead 59 to the VHF oscillator 56 to render it operative. An isolating diode 61 prevents the enabling potential for the VHF oscillator when a low-band VHF channel is selected from being applied through the switching diode 49 in the RF stage 46 of the tuner.

Whenever a UHF channel is selected, an enabling potential is applied to the UHF oscillator 57, as well as through the diode 51 to the RF stages 46, to enable the oscillator 57. Selection of a UHF channel is such that no enabling potential is applied to the oscillator 56; so that only one or the other of the oscillators 56 or 57 is effective at any time to apply a local oscillator input to the mixer 54.

Figure 5:
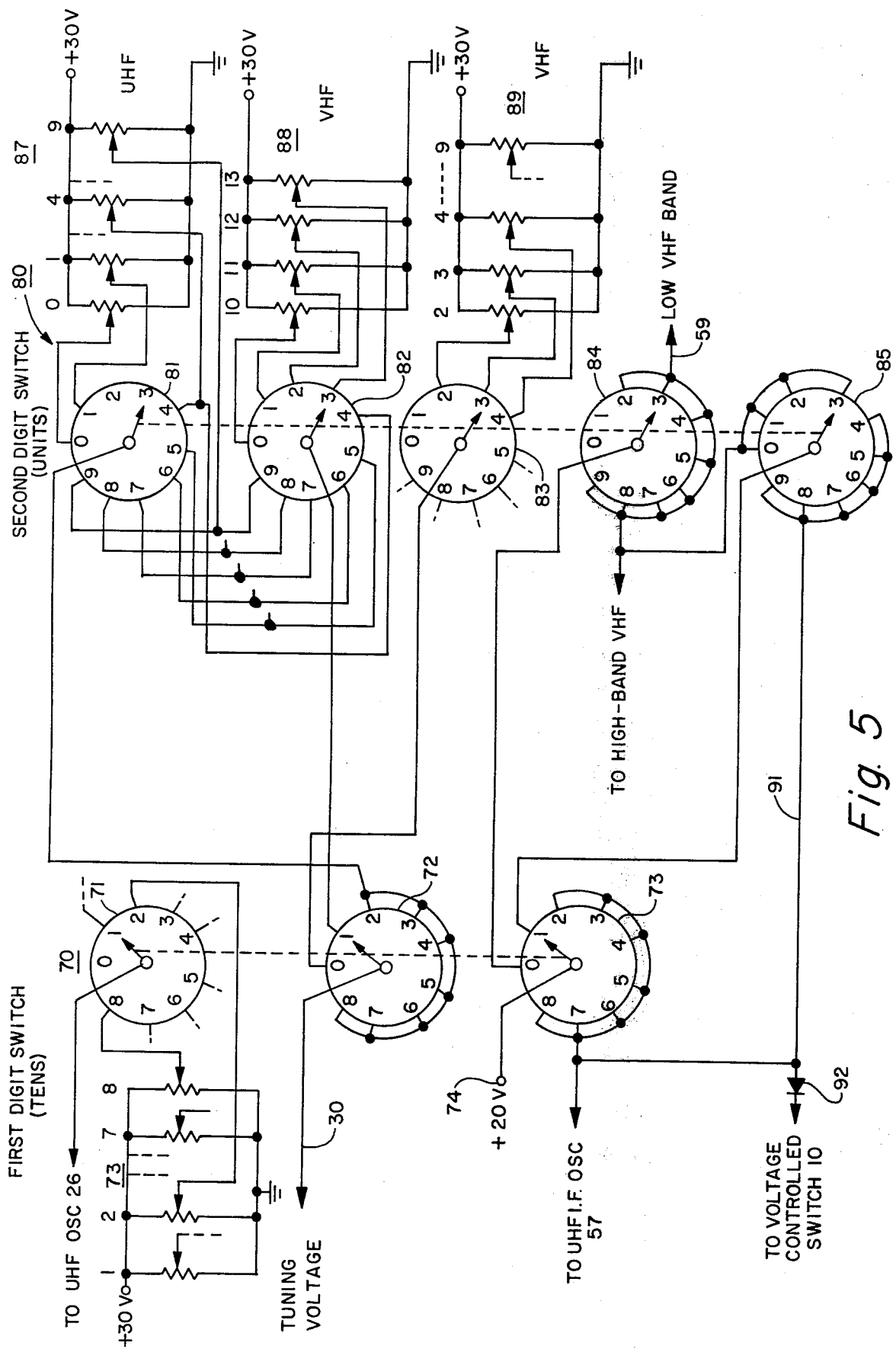
FIG. 5 is a schematic diagram of the channel selector used in the circuits of FIGS. 1 and 4.

Referring now to FIG. 5, there is shown a detailed schematic diagram of one form of a channel selector and potentiometer network which can be used in the circuits shown in FIGS. 1 and 4.

In FIG. 5, the channel selector is illustrated as including two interconnected multi-bank or multi-deck rotary wafer switches. This configuration of switches, however, is merely for purposes of illustration and other types of switching arrangements can be employed equally as well. For example, push-button switch configurations with multiple contacts or various types of electronic switching arrangements can be used. The multi-bank wafer switch readily lends itself to illustrating the features of the system, however, and for that reason it has been selected. The first switch 70 selects the first digit of the channel number, that is, the 10's digit. The second switch 80 is used to select the units digits of the switch. The switch 70 is a three-bank switch, while the switch 80 is illustrated as a five-bank switch.

Reference first is made to the first switch 70. This switch includes three banks, each having 9 fixed positions which are labeled in FIG. 5 as "0" through "8", respectively. These positions directly correspond to the first number (10's digit) of the selected channel. When the ganged moveable switch contacts of the three banks of the switch 80 are placed in the 0 position, this means that no UHF channels are selected, and only those VHF channels up to channel 9 are being selected by the channel selector switches.

The movable contact or wiper of the bank 71 is connected to the UHF oscillator 26 which, for the purposes of the discussion to follow, is a voltage controlled oscillator capable of being tuned to the various frequencies illustrated in FIG. 2. Of course, other forms of switched fixed frequency oscillators could be used, the most appropriate of which probably would comprise 8 crystal oscillators, each operating at a different frequency and capable of being switched into operation in accordance with the position of the wiper of bank 71 of the switch 70. A voltage controlled oscillator is presently more practical commercially than 8 separate crystal oscillators or a crystal oscillator frequency synthesizer combination.

Each of the positions of the switch bank 71, corresponding to switched positions 1 through 8, are connected to a different one of the taps of 8 different potentiometers of an oscillator control potentiometer bank 73. Each potentiometer is set to apply a different tuning voltage to the corresponding fixed input of the bank 71 of the switch and this voltage in turn is applied through the movable contact of the switch bank 71 to the oscillator 26 to control its frequency. In position 0 no voltage is applied from the movable contact to the oscillator since this position is used for VHF channels 2 through 9 only. But for each of the other positions, a unique tuning voltage corresponding to the particular decade of the UHF band channels being selected is applied to the oscillator 26. The switch 70 is shown with the movable contact of the bank 71 at position 1, corresponding to the UHF decade including channels 14 to 19 and also used to select VHF channels 10 through 13. In this position, the tap of the potentiometer used to tune the oscillator 26 to the lowest UHF decade is coupled through the switch bank 71 at position 1 to the control input of the UHF oscillator 26 (FIG. 1). A corresponding different output voltage is obtained from the bank 71 for each of the other different positions to which the switch 70 can be rotated.

The second bank 72, of the switch 70, is the bank which applies the tuning voltage from the tuning potentiometer network to the lead 30. Three different connections are effected between the lead 30, coupled to the movable contact of the bank 72, and the inputs to the fixed positions of the bank 72. These will be described subsequently in conjunction with the manner in which they interrelate with the different banks of the second switch 80 used to select the second digit of the desired channel number.

The third bank 73 of the switch 70 has a 20 volt DC supply applied to its movable contact at a terminal 74 from a suitable source (not shown). The bank 73 supplies the operating potentials for the oscillators 56 and 57, shown in FIG. 4, and applies the band switching potentials to the RF stages 46, also shown in FIG. 4. In addition, the output of the bank 73 applies operating potential to the voltage controlled switch 10 to effect its operation between the VHF and UHF IF inputs on the terminals 41 and 44, shown in FIG. 4. The manner in which the switch bank 73 operates is described subsequently in conjunction with the interconnections between it and corresponding banks of the switch 80.

The units digit switch 80 includes five banks 81, 82, 83, 84 and 85, respectively. Each of these banks is a 10-position bank, and the positions are numbered from 0 through 9 to correspond directly to the second digit of the selected channel number. It should be noted that the switches 70 and 80 can include or be connected directly to a channel indicator of any suitable type. The channel number directly corresponds to the switch positions which are selected by the movable contacts of the switches 70 and 80. By manipulating the switches 70 and 80 to the desired channel number, all of the subsequent tuning operations automatically take place to cause the tuner control circuit to tune the receiver to any VHF or UHF channel selected by the channel number. No other switches need to be operated, and the channel number read-out directly controls the proper tuning of the receiver.

The bank 81 of the units switch 80 is used primarily to select one of ten UHF potentiometers in a group 87 used to tune to each of the ten channels which are possible within each UHF decade. There is one potentiometer associated with the units digit 0 for all of the UHF decades, for example, the units digit for channels 20, 30, 40, etc. Similarly, there is one potentiometer in the potentiometer group 87 for each of the other units digits of the UHF channels in each UHF decade to which the receiver can be tuned. Only one potentiometer needs to be associated with each of these positions. For example, potentiometer 4 in the potentiometer group 87 corresponds to the UHF units digit 4 which appears, for example, in channel numbers 14, 24, 34, 54, etc. up to 74. This potentiometer is selected to provide the tuning voltage whenever any UHF channel having a units digit ending in 4 is selected. This is true of each of the ten potentiometers in the UHF potentiometer group 87. Each of these potentiometers has its tap connected to a corresponding fixed input of the bank 81 of the switch 80. As shown in FIG. 5, the ganged movable contacts of the banks 81 through 85 of the switch 80 are rotated to the "3" position indicative of a units digit 3 in the selected channel number.

The bank 82 of the switch 80 is required since some VHF channels also are included in the tens decade used for UHF channels 14 to 19. These VHF channels are channels 10, 11, 12 and 13. This switch bank 82 has four potentiometers in a potentiometer group 88 for providing the tuning voltages for these four VHF channels. The movable contact of the bank 82 is connected to the fixed contact at position 1 of the bank 72 in the switch 70. The VHF potentiometers for channels 10, 11, 12 and 13 are connected, respectively, to the 0, 1, 2 and 3 fixed input positions of the bank 82. Thus, any time one of these four VHF channels is selected when the switch 70 is turned to its "1" position, as shown in FIG. 5, the selected potentiometer tuning voltage from one of the potentiometers in the potentiometer group 88 is applied through the movable contact of the bank 82 to the fixed contact at position 1 of the bank 72. The tuning voltage then goes from the movable contact of the bank 72 to the lead 70.

The fixed contacts 4 through 9 of the banks 81 and 82 are interconnected. Thus, for channels 14 through 19 the UHF potentiometer voltage is selected by the bank 81 and is applied to the same numbered positions 4 through 9 of the bank 82 as well as to the corresponding positions of the bank 81. If any UHF channel 14 through 19 is selected, however, the bank 81 is ineffective to supply the tuning voltage to the bank 72; but the tuning voltage is applied through the movable contact of the bank 82.

For UHF channels 20 and above, the movable contact of the bank 72 connects any one of the fixed positions 2 through 8 of that contact. All of these are interconnected to the movable contact of the bank 81 of the switch 80. As a result, at each position of the switch bank 81, the selected one of the 10 UHF potentiometer voltages is applied directly to the common connection of the fixed contacts 2 through 8 of the switch bank 72 and from there through the movable contact of that bank to the tuning voltage lead 30.

For VHF channels 2 through 9 the switch 70 is moved to its 0 position. In this position the movable contact of the bank 83 of the switch 80 is connected through the movable contact of the bank 72 to the tuning voltage lead 30. A VHF potentiometer group 89 includes 8 potentiometers "2" through "9" which supply the tuning voltages for channels 2 through 9 inclusive. These potentiometers are connected to the fixed contact points 2 through 9 on the bank 83. Contact points 0 and 1 on that bank are left open. Thus, any time any one of the VHF channels 2 through 9 is selected, the tuning voltage from the selected channel is applied through the 0 fixed input and the movable contact of the bank 72 of the switch 70 to the tuning voltage output lead 30.

It can readily be seen that this combination and interconnection of the banks of the switches 70 and 80 with the tuning potentiometers in the groups 87, 88 and 89 permits tuning of the television receiver to any one of the VHF channels and to any of the 70 UHF channels automatically and directly merely by selection of the desired channel number on the two switches 70 and 80.

Only ten UHF potentiometers are necessary to supply all of the tuning voltages for the UHF channels. If a voltage controlled oscillator is used for the oscillator 26, an additional eight potentiometers are required (group 73) to complete the UHF tuning of the receiver, making a total of 18 potentiometers for all 70 UHF channels. This, however, is far less than the 70 potentiometers which normally are required to permit factory programmed electronic tuning of a television receiver to any UHF channel which the receiver may be capable of receiving.

Banks 84 and 85 of the units switch 80 in conjunction with bank 73 of the 10's switch 70 operate to effect the band switching operation of the tuner 11 and also to control the switching of the voltage controlled switch 10 shown in FIGS. 1 and 4. For the low VHF band channels, the tens switch 70 is in its 0 position. This couples the 20 volts DC on the terminal 74 through the movable contact of the bank 73 to the movable contact of the bank 84 in the switch 80. In the switch 80, the fixed contact points 0 and 1 are open-circuited since there are no lowband VHF channels corresponding to these positions. Fixed positions 2 through 6, however, are interconnected to a common low-band VHF output lead 59 (shown also in FIG. 4). Thus, if any of the VHF channels 2 through 6 are selected, a positive potential appears on the lead 59.

Similarly, fixed contact points 7, 8 and 9 on the bank 84 interconnected to a common output which is the VHF high-band output (also shown in FIG. 4). As a consequence, when any one of the VHF channels 7, 8 or 9 is selected, a positive potential appears on this VHF highband output.

If one of the VHF high-band channels 10, 11, 12 or 13 is selected the tens digit switch 70 is moved to its position 1 interconnecting the movable contact of the bank 73 with the movable contact of the bank 85. This then removes the potential applied to the movable contact of the bank 84, disabling that bank from any further operation. The movable contact of the bank 85, however, is provided with a positive potential in this position. The fixed contacts 0, 1, 2 and 3 are interconnected in common to the high-band VHF output terminal along with the outputs for fixed points 7, 8 and 9 from the bank 84. Thus, if any one of channels 10, 11, 12 or 13 is selected a positive potential appears on the high-band VHF output lead from the switch 80.

Now assume that a UHF channel 14 through 19 is selected. The movable contact of the switch bank 73 remains connected to fixed contact 1 as shown in FIG. 5. The movable contact for the bank 85, however, makes connection with one of the fixed contacts 4 through 9 of the bank 85. All of these contacts are connected in common to an output lead 91 to apply a positive enabling potential to the UHF IF oscillator output to enable the UHF IF oscillator 57 shown in FIG. 4. At the same time, the positive potential is applied through an isolating diode 92 to the voltage controlled switch 19 to operate it to close on the UHF contact 41 (FIG. 4).

Whenever any of the UHF channels 20 through 83 are selected, the banks 84 and 85 of the switch 80 are disabled. The potential on the lead 74 then is applied through the movable contact of the bank 73 to the common-connected fixed contacts 2 through 8 of the bank 73, to apply the enabling potential to the UHF IF oscillator 57 and through the diode 92 to the voltage controlled switch 10.

The tuning control system which has been described is a highly effective control system using a minimum number of tuning potentiometers for permitting direct channel selection of any of the VHF and UHF channels which presentday television receivers are capable of receiving.

I claim:

1. A tuning control system for a wave signal receiver capable of receiving signals from different stations in a plurality of frequency bands including in combination:

first mixer circuit means with first and second inputs and an output;

means for supplying signals in one of said plurality of frequency bands to the first input of said first mixer circuit means;

variable frequency oscillator means responsive to control signals applied to a control input for supplying signals to the second input of said first mixer circuit means, said oscillator supplying signals at a plurality of requencies, each having a predetermined relationship with a predetermined portion of the frequencies of said one of said plurality of frequency bands;

switching circuit means with at least first and second inputs and an output, the inputs of said switching circuit means selectively coupled with the output thereof;

means for coupling the output of said first mixer circuit means with the first input of said switching circuit means;

means for supplying signals in at least a second one of said plurality of frequency bands to the second input of said switching circuit means;

tuner circuit means controllable for tuning the receiver to different received signals;

means for coupling the output of said switching circuit means with the input of said tuner circuit means; a selection circuit comprising first and second multibank switches, the first bank thereof being settable directly to the tens digits of a selected television channel number, and including a first bank of elements therein settable to different positions for supplying control signals to the control input of said variable frequency oscillator means to cause said variable frequency oscillator means to produce an output frequency uniquely related to the corresponding tens decade of the UHF television signals directly represented by the digit selected by the first bank of elements of said first multi-bank switch, said first multi-bank switch further having a second bank of elements for supplying a tuning voltage to said tuner circuit means and having a third bank of elements for controlling the operation of said switching circuit means; said second multi-bank switch being settable to the units digits of a selected television channel number and having at least one first bank of elements thereof settable to different positions, each adapted for coupling with a tuning voltage supply means and interconnected with the second bank of elements of said first multi-bank switch to supply a unique tuning voltage thereto for controlling said tuner circuit means, said second multi-bank switch further comprising second and third banks of switching elements interconnected with the third bank of elements of said first multi-bank switch for controlling said switching circuit means in accordance with the combination of settings of said first and second multi-bank switches.

2. The combination according to claim 1 wherein first predetermined combinations of settings of said first and second multibank switches controlling said switching circuit means to couple the first input thereof with its output and second predetermined combinations of settings of said first and second multibank switches causing said second input of said switching circuit means to be coupled with the output thereof.

3. The combination according to claim 1 wherein the wave signal receiver comprises a television receiver; said one of said plurality of frequency bands comprises the UHF frequency band of television signals and said at least a second one of said plurality of frequency bands comprises a VHF frequency band of television signals; said variable frequency oscillator means produces eight different discrete output frequencies, each uniquely corresponding to the transmitted UHF television frequencies in a different decade of channels, and said first and second multi-bank switches control said tuner means to effect tuning thereof for each different one of the pluralities of settings thereof to different UHF and VHF channels, the first settings for the UHF channels within each decade operating to supply a control input signal to the control input of said variable frequency oscillator to cause the output frequency thereof to be the one of said eight different frequencies uniquely corresponding to such UHF channels in each such decade.

4. The combination according to claim 3 wherein the eight different output frequencies supplied by said variable frequency oscillator means for each of the eight different decades of UHF signals are 727 megahertz for the lowest decade thereof, with the frequency for each of the other seven decades successively being 60 herahertz higher than that for the immediately preceding decade.

5. The combination according to claim 1 wherein the tuner circuit means comprises a voltage controlled tuner and said multi-bank switches supply a unique tuning voltage to the tuner circuit means corresponding to each combination of the settings thereof.

6. The combination according to claim 1 wherein said second bank of switches is a ten position rotary switch, having three first banks, and further including a first group of 10 potentiometers, each having an output tap coupled with a different fixed position of one of said first banks of said second multi-bank switch, a second group of 4 potentiometers each having a tap connected to positions 0 through 3 of a second one of said first banks of said second multi-bank switch; and a third group of eight potentiometers each having an output tap coupled with the fixed positions 2 through 9 of a third one of said first banks of said second multi-bank switch; fixed positions 4 through 9 of the first and second ones of said first banks of said second multi-bank switch being interconnected, the movable contact of said first one of said first banks of said second multi-bank switch being connected in common with the 2 through 8 fixed positions of the second one of said first banks of said first multi-bank switch, the movable contact of the second bank of said second multi-bank switch being connected with the fixed 1 position of the second bank of said first multi-bank switch, and the movable contact of the third bank of said second multi-bank switch being connected with the 0 position of the second bank of said first multi-bank switch, and the movable contact of the second bank of said first multi-bank switch supplying said tuning voltage to said tuner circuit means.

* * * * *